(12) United States Patent
Chen et al.

US011183454B2

(10) Patent No.: US 11,183,454 B2
(45) Date of Patent: Nov. 23, 2021

(54) FUNCTIONAL COMPONENT WITHIN INTERCONNECT STRUCTURE OF SEMICONDUCTOR DEVICE AND METHOD OF FORMING SAME

(71) Applicant: Taiwan Semiconductor Manufacturing Company, Ltd., Hsinchu (TW)

(72) Inventors: Hsien-Wei Chen, Hsinchu (TW); Ming-Fa Chen, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/674,232

(22) Filed: Nov. 5, 2019

(65) Prior Publication Data

US 2020/0176380 A1 Jun. 4, 2020

Related U.S. Application Data

(60) Provisional application No. 62/773,329, filed on Nov. 30, 2018.

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76816* (2013.01); *H01L 21/76877* (2013.01);
(Continued)

(58) Field of Classification Search
CPC ........... H01L 23/5226; H01L 21/76816; H01L 23/481; H01L 23/5283; H01L 23/5223; H01L 21/76877
See application file for complete search history.

(56) References Cited

U.S. PATENT DOCUMENTS 7,968,460 B2 * 6/2011 Kirby ................ H01L 21/76831
438/667
2012/0043666 A1 2/2012 Park et al.
(Continued)

FOREIGN PATENT DOCUMENTS

JP H113888 A 1/1999
JP 5601380 B2 10/2014
(Continued)

*Primary Examiner* — Shahed Ahmed
*Assistant Examiner* — Vicki B. Booker
(74) *Attorney, Agent, or Firm* — Slater Matsil, LLP

(57) ABSTRACT

A semiconductor device includes a substrate. A first dielectric layer is over the substrate. A first interconnect is in the first dielectric layer. A second dielectric layer is over the first dielectric layer and the first interconnect. A conductive via extends through the first dielectric layer, the second dielectric layer and the substrate. A topmost surface of the conductive via is level with a topmost surface of the second dielectric layer. A third dielectric layer is over the second dielectric layer and the conductive via. A fourth dielectric layer is over the third dielectric layer. A second interconnect is in the fourth dielectric layer. The second interconnect extends through the third dielectric layer and the second dielectric layer and physically contacts the first interconnect.

20 Claims, 20 Drawing Sheets

(51) Int. Cl.
H01L 23/48 (2006.01)
H01L 23/528 (2006.01)

(52) U.S. Cl.
CPC ........ H01L 23/481 (2013.01); H01L 23/5223 (2013.01); H01L 23/5283 (2013.01)

(56) References Cited

U.S. PATENT DOCUMENTS

| | | |
|---|---|---|
| 2013/0119547 A1 | 5/2013 | Kim et al. |
| 2013/0273701 A1 | 10/2013 | Ochimizu et al. |
| 2015/0028450 A1 | 1/2015 | Park et al. |

FOREIGN PATENT DOCUMENTS

| | | |
|---|---|---|
| KR | 20130053338 A | 5/2013 |
| KR | 20150012574 A | 2/2015 |
| TW | I503981 B | 10/2015 |
| TW | I534876 B | 5/2016 |

* cited by examiner

FUNCTIONAL COMPONENT WITHIN INTERCONNECT STRUCTURE OF SEMICONDUCTOR DEVICE AND METHOD OF FORMING SAME

PRIORITY CLAIM AND CROSS-REFERENCE

This application claims the benefit of U.S. Provisional Application No. 62/773,329, filed on Nov. 30, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
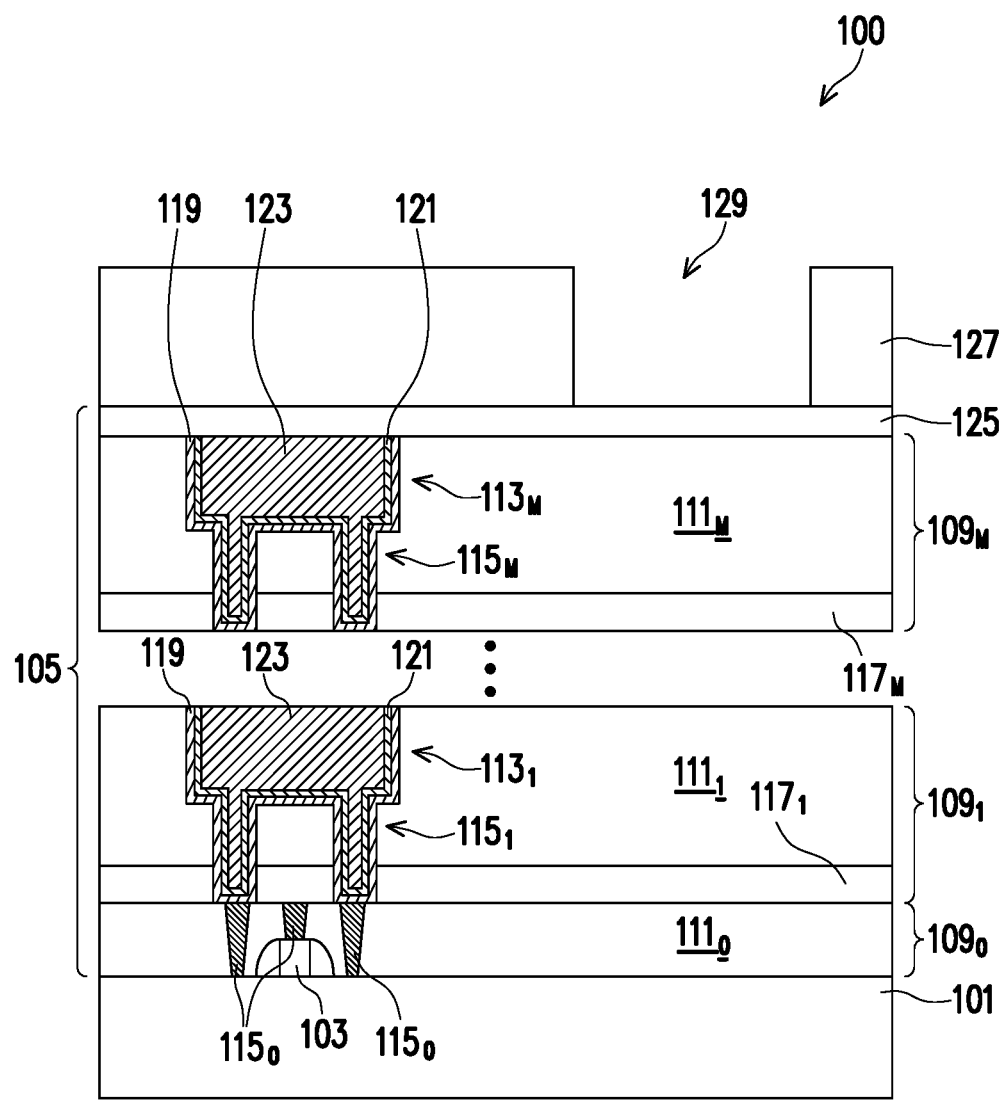
FIGS. 1-8 illustrate cross-sectional views of various intermediate stages of fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a functional component within an interconnect structure of a semiconductor device and a method of forming the same. The functional component may be a through substrate via (TSV) structure or a capacitor. Various embodiments discussed herein allow for integrating process steps for forming a functional component with process steps for forming an interconnect structure of a semiconductor device. Various embodiments discussed herein further allow for avoiding dishing or erosion of conductive features of the interconnect structure while performing a planarization process on a functional component.

FIGS. 1-8 illustrate cross-sectional views of various intermediate stages of fabrication of a semiconductor device 100 in accordance with some embodiments. Referring to FIG. 1, a portion of a semiconductor device 100 is illustrated. The semiconductor device 100 may be an intermediate structure of an integrated circuit manufacturing process. In some embodiments, the semiconductor device 100 may comprise a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 103 (illustrated in FIG. 1 as a single transistor) are formed on the substrate 101. The one or more active and/or passive devices 103 may include transistors, capacitors, resistors, diodes, photo-diodes, fuses, or the like. The one or more active and/or passive devices 103 may be formed using any acceptable methods. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 105 is formed over the one or more active and/or passive devices 103 and the substrate 101. The interconnect structure 105 electrically interconnects the one or more active and/or passive devices 103 to form functional electrical circuits within the semiconductor device 100. The interconnect structure 105 may comprise one or more metallization layers $109_0$ to $109_M$, wherein M+1 is the number of the one or more metallization layers $109_0$ to $109_M$. In some embodiments, the value of M may vary according to design specifications of the semiconductor device 100. In some embodiments, the metallization layer $109_M$ may be an intermediate metallization layer of the interconnect structure 105. In such embodiments, further metallization layers are formed over the metallization layer $109_M$. In other embodiments, the metallization layer $109_M$ may be the final metallization layer of the interconnect structure 105. In some embodiments, M is equal to 1. In other embodiments, M is greater than 1.

In some embodiments, the one or more metallization layers $109_0$ to $109_M$, comprise one or more dielectric layers $111_0$ to $111_M$, respectively. The dielectric layer $111_0$ is an inter-layer dielectric (ILD) layer, and the dielectric layers $111_1$ to $111_M$ are inter-metal dielectric (IMD) layers. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), atomic layer deposition (ALD), a combination thereof, or the like.

In some embodiments, etch stop layers (ESLs) $117_1$ to $117_M$ are formed between adjacent ones of the dielectric layers $111_0$ to $111_M$. A material for the ESLs $117_1$ to $117_M$ is chosen such that etch rates of the ESLs $117_1$ to $117_M$ are less then etch rates of corresponding ones of the dielectric layers $111_0$ to $111_M$. In some embodiments, an etching process that etches the dielectric layers $111_0$ to $111_M$ faster than the ESLs $117_1$ to $117_M$ is a dry etching process performed using an etchant comprising a $C_xF_y$-based gas, or the like. In some embodiments, an etch rate of the ESL $117_K$ is less than an etch rate of the dielectric layer $111_K$ (with K=1, ..., M). In some embodiments, each of the ESLs $117_1$ to $117_M$ may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like.

In some embodiments, the metallization layer $109_0$ further comprises conductive plugs $115_0$ within the dielectric layer $111_0$, and the metallization layers $109_1$ to $109_M$ further comprise one or more conductive interconnects, such as conductive lines $113_1$ to $113_M$ and conductive vias $115_1$ to $115_M$, within the dielectric layers $111_1$ to $111_M$, respectively. The conductive plugs $115_0$ electrically couple the one or more active and/or passive devices 103 to the conductive lines $113_1$ to $113_M$ and the conductive vias $115_1$ to $115_M$. In some embodiments, the conductive lines $113_1$ to $113_M$ may have a width between about 0.05 μm and about 12 μm.

In some embodiments, the conductive plugs $115_0$, the conductive lines $113_1$ to $113_M$ and the conductive vias $115_1$ to $115_M$ may be formed using any suitable method, such as a damascene method, a dual damascene method, or the like. In some embodiments, the steps for forming the conductive plugs $115_0$, the conductive lines $113_1$ to $113_M$ and the conductive vias $115_1$ to $115_M$ include forming openings in the respective dielectric layers $111_0$ to $111_M$, depositing one or more barrier/adhesion layers 119 (not explicitly shown in the conductive plugs $115_0$) in the openings, depositing seed layers 121 (not explicitly shown in the conductive plugs $115_0$) over the one or more barrier/adhesion layers 119, and filling the openings with a conductive material 123 (not explicitly shown in the conductive plugs $115_0$). A chemical mechanical polishing (CMP) is then performed to remove excess materials of the one or more barrier/adhesion layers 119, the seed layers 121, and the conductive material 123 overfilling the openings. In some embodiments, topmost surfaces of the conductive plugs $115_0$ are level with a topmost surface of the dielectric layer $111_0$. In some embodiments, topmost surfaces of the conductive lines $113_1$ to $113_M$ are level with topmost surface of the dielectric layers $111_1$ to $111_M$.

In some embodiments, the one or more barrier/adhesion layers 119 may comprise titanium, titanium nitride, tantalum, tantalum nitride, a combination thereof, or the like, and may be formed using PVD, CVD, ALD, a combination thereof, or the like. In some embodiments, the one or more barrier/adhesion layers 119 may have a thickness between about 100 Å and about 300 Å. The one or more barrier/adhesion layers 119 protect the respective dielectric layers $111_0$ to $111_M$ from diffusion and metallic poisoning. The seed layers 121 may comprise copper, titanium, nickel, gold, manganese, a combination thereof, or the like, and may be formed by ALD, CVD, PVD, sputtering, a combination thereof, or the like. In some embodiments, the seed layers 121 may have a thickness between about 1000 Å and about 3000 Å. The conductive material 123 may comprise copper, aluminum, tungsten, combinations thereof, alloys thereof, or the like, and may be formed using, for example, by plating, or other suitable methods.

Referring further to FIG. 1, a dielectric layer 125 is formed over the dielectric layer $111_M$ and the conductive lines $113_M$. As described below in greater detail, the dielectric layer 125 acts as a CMP stop layer while forming a trough substrate via (TSV) structure 501 (see, for example, FIG. 5) within the interconnect structure 105 and the substrate 101. Furthermore, as described below in greater detail, the dielectric layer 125 also acts as an ESL while forming conductive vias $115_{M+1}$ (see, for example, FIG. 6) over the conductive lines $113_M$. Accordingly, the dielectric layer 125 may be also referred to as a CMP stop layer or as an ESL. In some embodiments, the dielectric layer 125 may be formed using similar materials and methods as the ESLs $117_1$ to $117_M$, and the description is not repeated herein. In some embodiments, the dielectric layer 125 as formed has a thickness between about 200 Å and about 500 Å, such as about 300 Å. Such a thickness range for the dielectric layer 125 allows for using the dielectric layer 125 both as the ESL and the CMP stop layer and allows for improved CMP uniformity and ESL control.

After forming the dielectric layer 125, a mask layer 127 is formed over the dielectric layer 125 and is patterned to form an opening 129 in the mask layer 127. In some embodiments, the mask layer 127 may comprise one or more layers of photo-patternable and non-photo-patternable materials. In some embodiments, the mask layer 127 may comprise a photoresist, which may be patterned using suitable photolithography methods to form the opening 129. As described below in greater detail, the mask layer 127 is used as an etch mask to form an opening in the interconnect structure 105 and the substrate 101 for a subsequently formed TSV structure.

Figure 2:
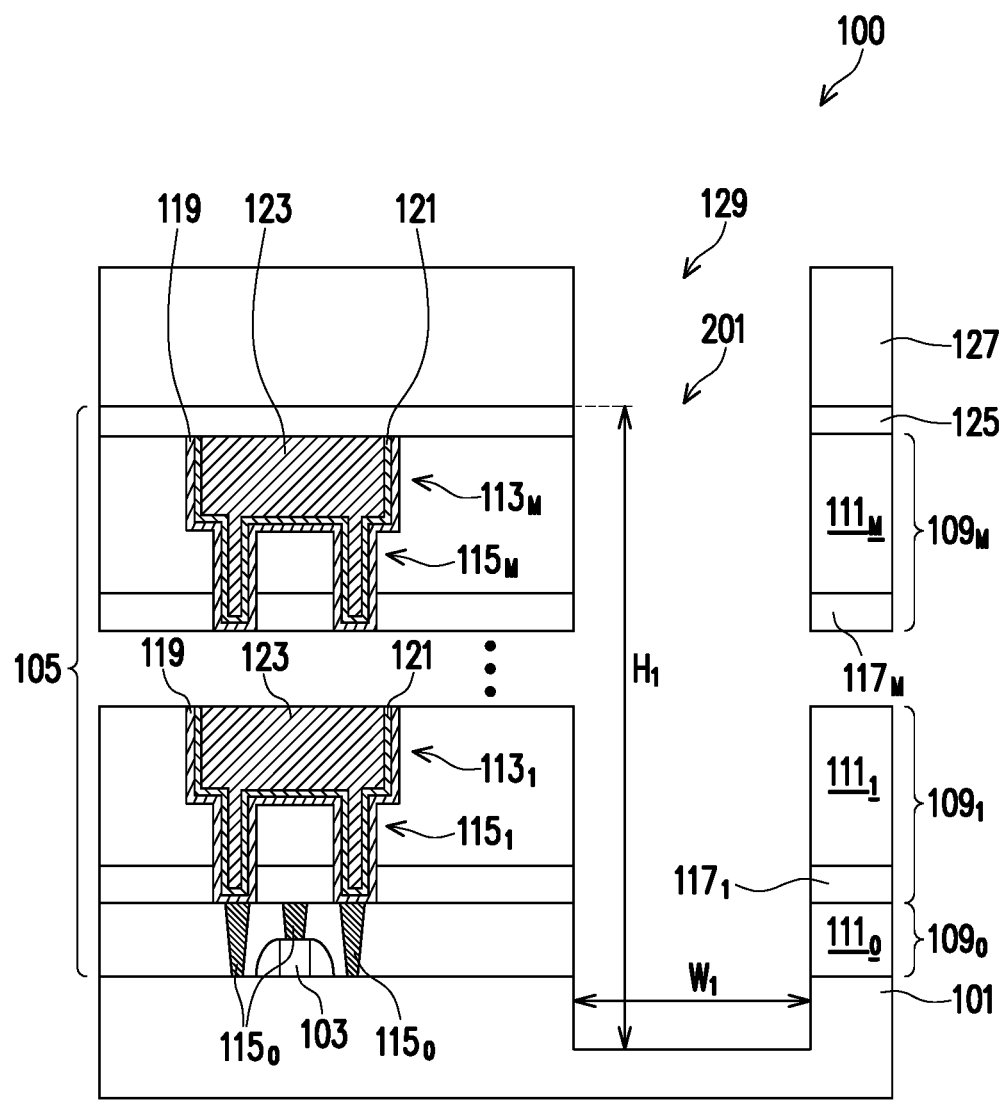

Referring to FIG. 2, the interconnect structure 105 and the substrate 101 are patterned to form an opening 201. In some embodiments, the opening 201 extends through the dielectric layer 125, the dielectric layers $111_0$ to $111_M$, and the ESLs $117_0$ to $117_M$, and into the substrate 101. In some embodiments, the interconnect structure 105 and the substrate 101 may be patterned using a suitable etching process, while using the mask layer 127 as an etch mask. In some embodiments, the suitable etching process may comprise one or more dry etching processes, such as a reactive ion etching (RIE) process, a neutral beam etching (NBE) process, or the like. In some embodiments, the suitable etching process may be an anisotropic etching process. In some embodiments, the opening 201 has a width $W_1$ between about 2 μm and about 3 μm. In some embodiments, the opening 201 has a height $H_1$ between about 20 μm and about 50 μm.

Figure 3:
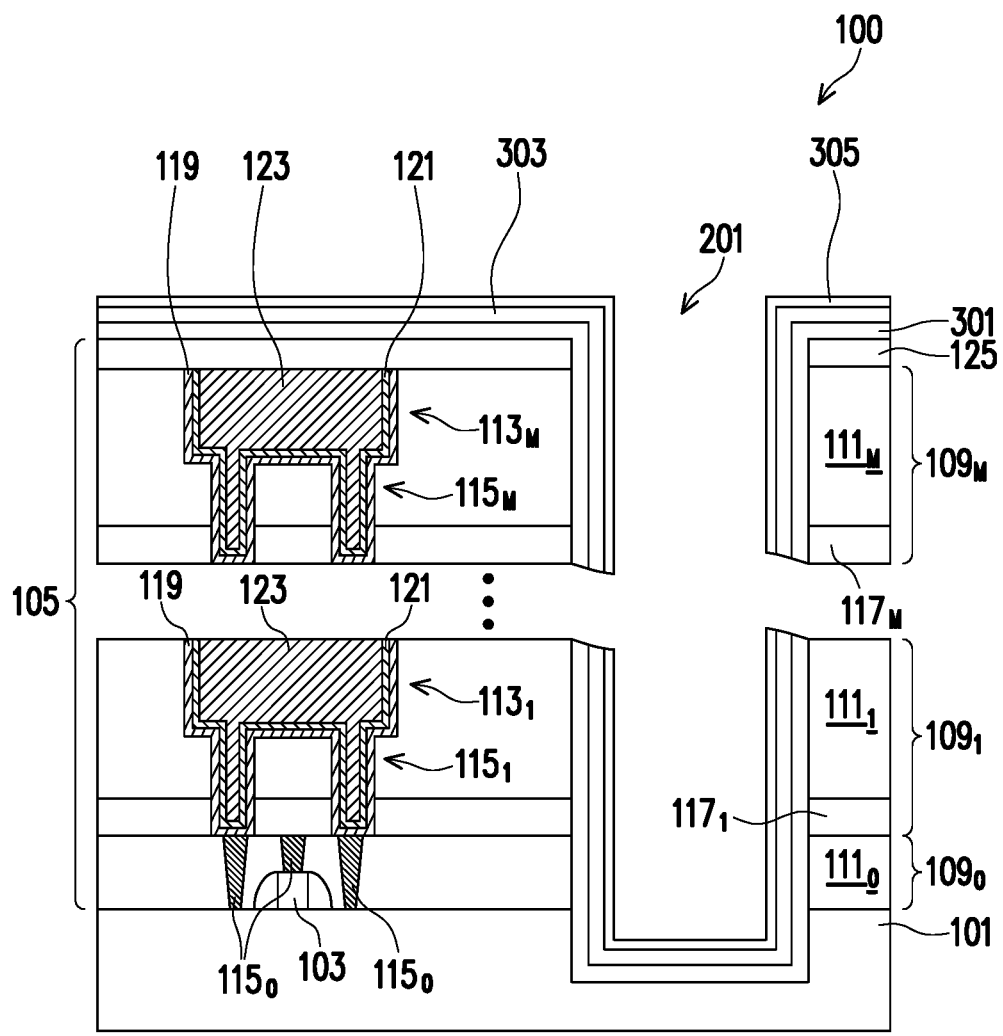

Referring to FIG. 3, after forming the opening 201, the mask layer 127 (see FIG. 2) is removed. In some embodiments, the mask layer 127 formed of a photoresist may be removed using an ashing process followed by a wet clean process. Subsequently, a liner layer 301 is formed along sidewalls and a bottom surface of the opening 201 and over a top surface of the dielectric layer 125. In some embodiments, the liner layer 301 may comprise a suitable insulating material to electrically isolate conductive portions of the subsequently formed TSV structure from surrounding layers, such the dielectric layer 125, the dielectric layers $111_0$ to $111_M$, the ESLs $117_0$ to $117_M$, and the substrate 101. In some embodiments, the liner layer 301 may comprise silicon oxide, silicon nitride, a combination thereof, or the like, and may be formed using ALD, CVD, PECVD, a combination thereof, or the like. In some embodiments, the liner layer 301 has a thickness between about 1000 Å and about 2000 Å.

After forming the liner layer 301, a barrier layer 303 is formed over the liner layer 301. In some embodiments, the barrier layer 303 may comprise titanium, titanium nitride, tantalum, tantalum nitride, a combination thereof, or the like, and may be formed using PVD, CVD, ALD, a combination thereof, or the like. In some embodiments, the barrier layer 303 has a thickness between about 500 Å and about 2000 Å.

After forming the barrier layer 303, a seed layer 305 is formed over the barrier layer 303. In some embodiments, the seed layer 305 may comprise copper, titanium, nickel, gold, manganese, a combination thereof, or the like, and may be formed by ALD, CVD, PVD, sputtering, a combination thereof, or the like. In some embodiments, the seed layer 305 has a thickness between about 3000 Å and about 7000 Å.

Figure 4:
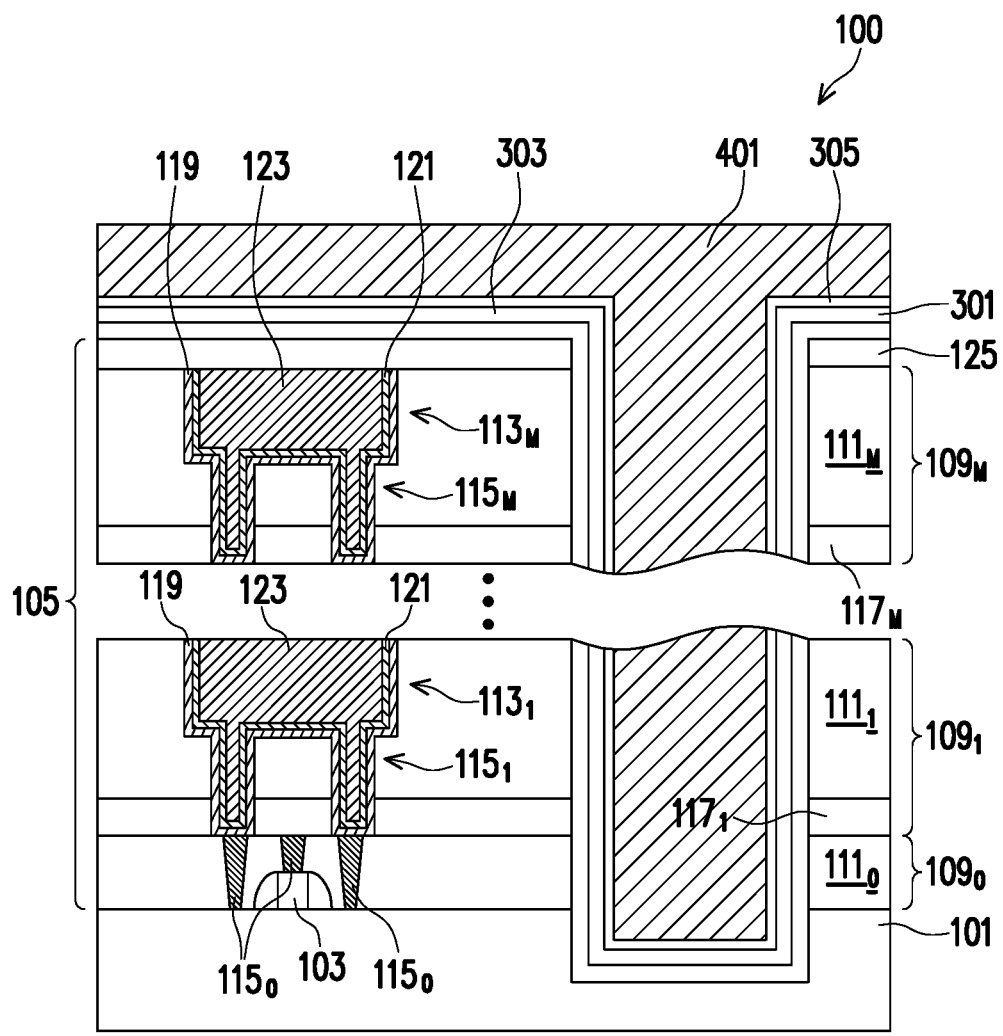

Referring to FIG. 4, after forming the seed layer 305, a remaining portion of the opening 201 (see FIG. 3) is filled with a conductive material 401. In some embodiments, the conductive material 401 overfills the opening 201, such that a portion of the conductive material 401 extends along the top surface of the dielectric layer 125. The conductive material 401 may comprise copper, aluminum, tungsten, combinations thereof, alloys thereof, or the like, and may be formed using, for example, by plating, or other suitable methods.

Figure 5:
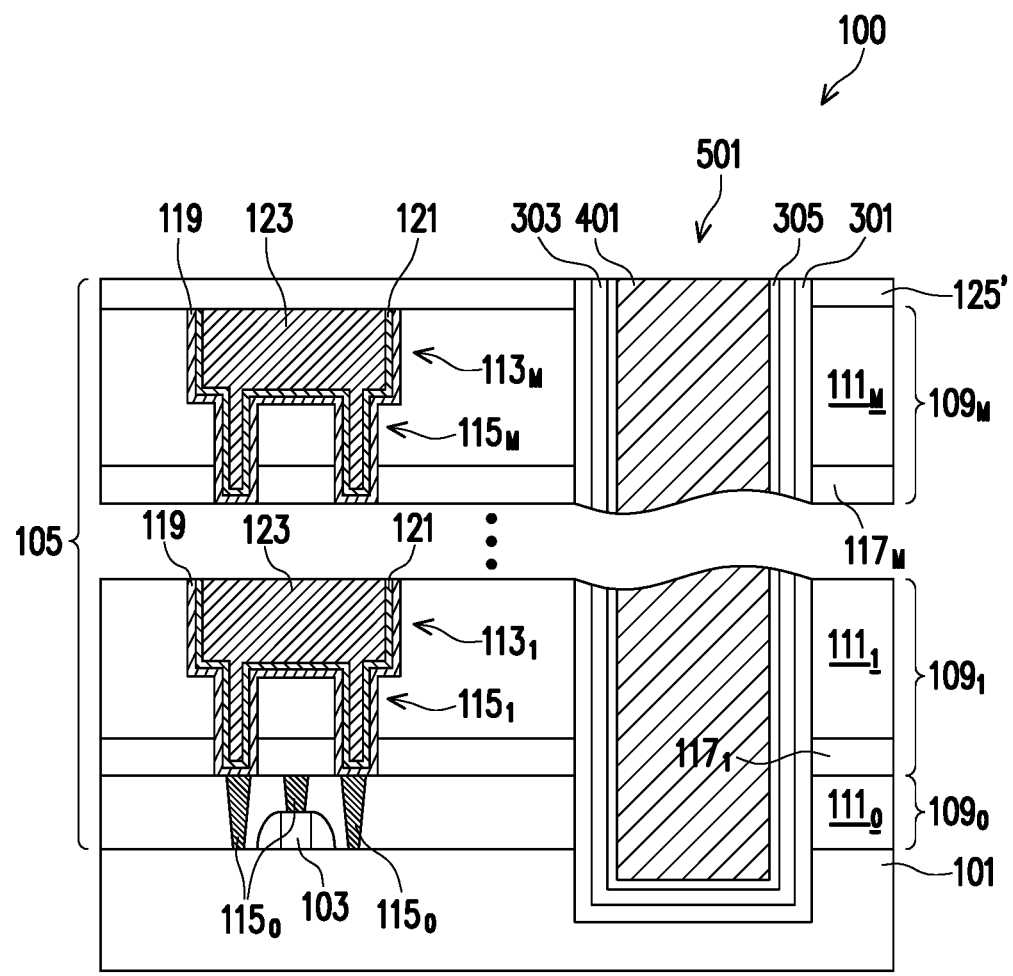

Referring to FIG. 5, potions of the liner layer 301, the barrier layer 303, the seed layer 305 and the conductive material 401 overfilling the opening 201 (see FIG. 3) are removed. Remaining portions of the liner layer 301, the barrier layer 303, the seed layer 305 and the conductive material 401 form a TSV structure 501. In some embodiments, the removal process may comprise a CMP process, a grinding process, an etching process, a combination thereof, or the like. In some embodiments where the removal process comprises a CMP process, the dielectric layer 125 acts as a CMP stop layer and the CMP process is stopped after exposing the dielectric layer 125 and before exposing the conductive material 123 of the conductive line $113_M$, such that at least a portion of the dielectric layer 125 covers the conductive material 123 of the conductive line $113_M$. In some embodiments where the removal process comprises a CMP process, a ratio of a removal rate of the conductive material 401 to a removal rate of the dielectric layer 125 is greater than about 10. In some embodiments, the CMP process may also thin the dielectric layer 125 to form a thinned dielectric layer 125', such that the thinned dielectric layer 125' covers the conductive material 123 of the conductive line $113_M$. In some embodiments, by keeping the thinned dielectric layer 125' over the conductive line $113_M$, dishing or erosion of the conductive line $113_M$ may be avoided while performing the CMP process. In some embodiments, a topmost surface of the TSV structure 501 is level with a topmost surface of the thinned dielectric layer 125'. In some embodiments, the thinned dielectric layer 125' has a thickness between about 50 Å and about 200 Å, such as about 100 Å.

Figure 6:
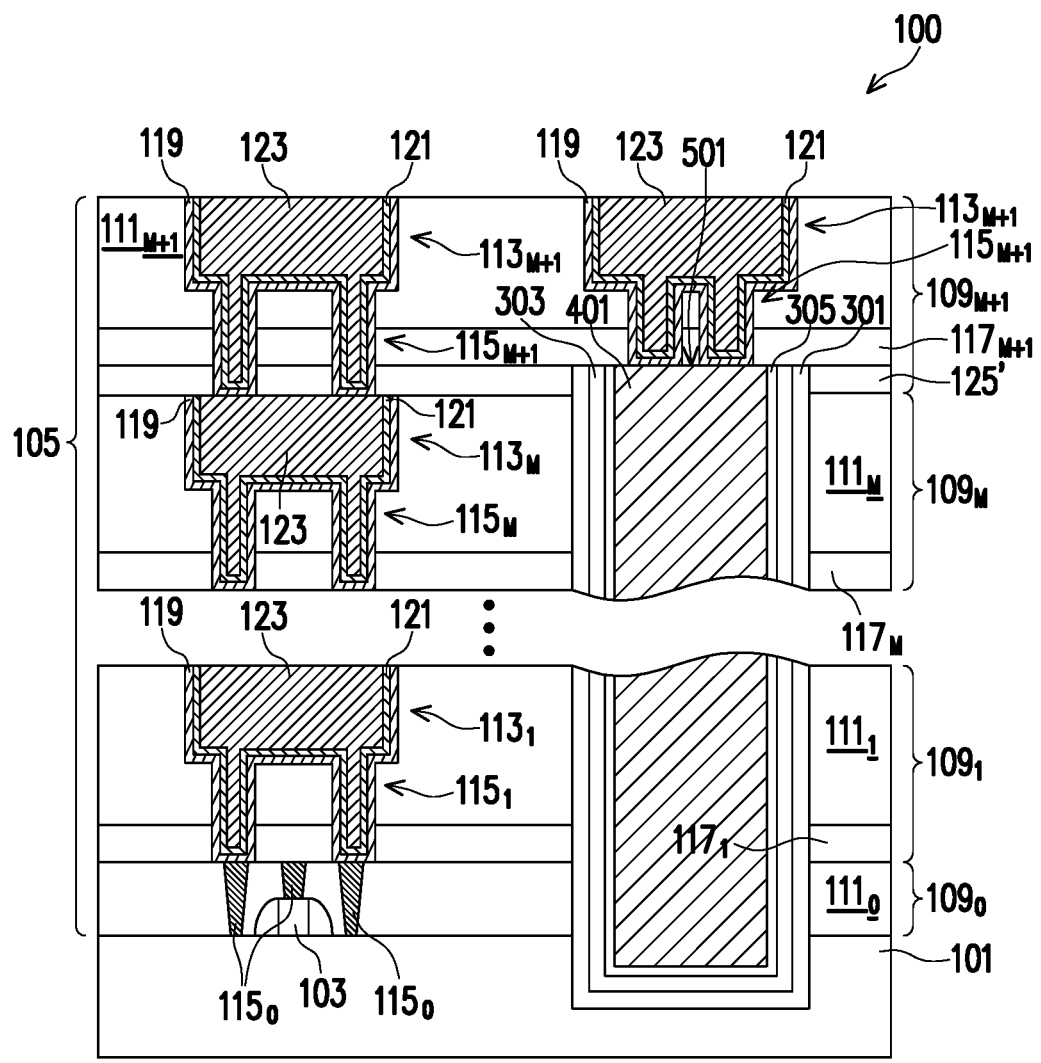

Referring to FIG. 6, after forming the TSV structure 501, a metallization layer $109_{M+1}$ is formed over the metallization layer $109_M$ and the TSV structure 501. In some embodiments, the metallization layer $109_{M+1}$ comprises an ESL $117_{M+1}$, a dielectric layer $111_{M+1}$ and conductive interconnects comprising conductive lines $113_{M+1}$ and conductive vias $115_{M+1}$. In some embodiments, the ESL $117_{M+1}$ may be formed using similar materials and method as the ESLs $117_1$ to $117_M$ described above with reference to FIG. 1, and the description is not repeated herein. In some embodiments, the dielectric layer $111_{M+1}$ may be formed using similar materials and method as the dielectric layers $111_0$ to $111_M$ described above with reference to FIG. 1, and the description is not repeated herein. In some embodiments, the conductive lines $113_{M+1}$ and the conductive vias $115_{M+1}$ may be formed using similar materials and method as the conductive lines $113_1$ to $113_M$ and conductive vias $115_1$ to $115_M$ described above with reference to FIG. 1, and the description is not repeated herein. In some embodiment, the ESL $117_{M+1}$ has a thickness between about 100 Å and about 350 Å.

In some embodiments, the dielectric layer 125' and the ESL $117_{M+1}$ act as a combined ESL, which is used to aid in forming openings for the conductive vias $115_{M+1}$. In some embodiments, the combined ESL has a thickness between about 300 Å and about 400 Å. In some embodiments, the thickness of the ESL $117_{M+1}$ is greater than the thickness of the dielectric layer 125'. In other embodiments, the thickness of the ESL $117_{M+1}$ is less than or equal to the thickness of the dielectric layer 125'. In some embodiments, the dielectric layer 125' is thinned during the CMP process described above with reference to FIG. 5 to such a small thickness that the conductive vias $115_{M+1}$ above the conductive lines $113_M$ and the conductive vias $115_{M+1}$ above the TSV structure 501 have similar profiles. In the embodiment illustrated in FIG. 6, the ESL $117_{M+1}$ and the dielectric layer 125' comprise a same material. In such embodiments, an interface between the ESL $117_{M+1}$ and the dielectric layer 125' may not be detectable. Furthermore, widths of the conductive vias $115_{M+1}$ do not change as the conductive vias $115_{M+1}$ extend through the ESL $117_{M+1}$ and the dielectric layer 125'. In other embodiments, the ESL $117_{M+1}$ and the dielectric layer 125' may comprise different materials. Such an embodiment is illustrated in FIGS. 9A and 9B.

Figure 7:
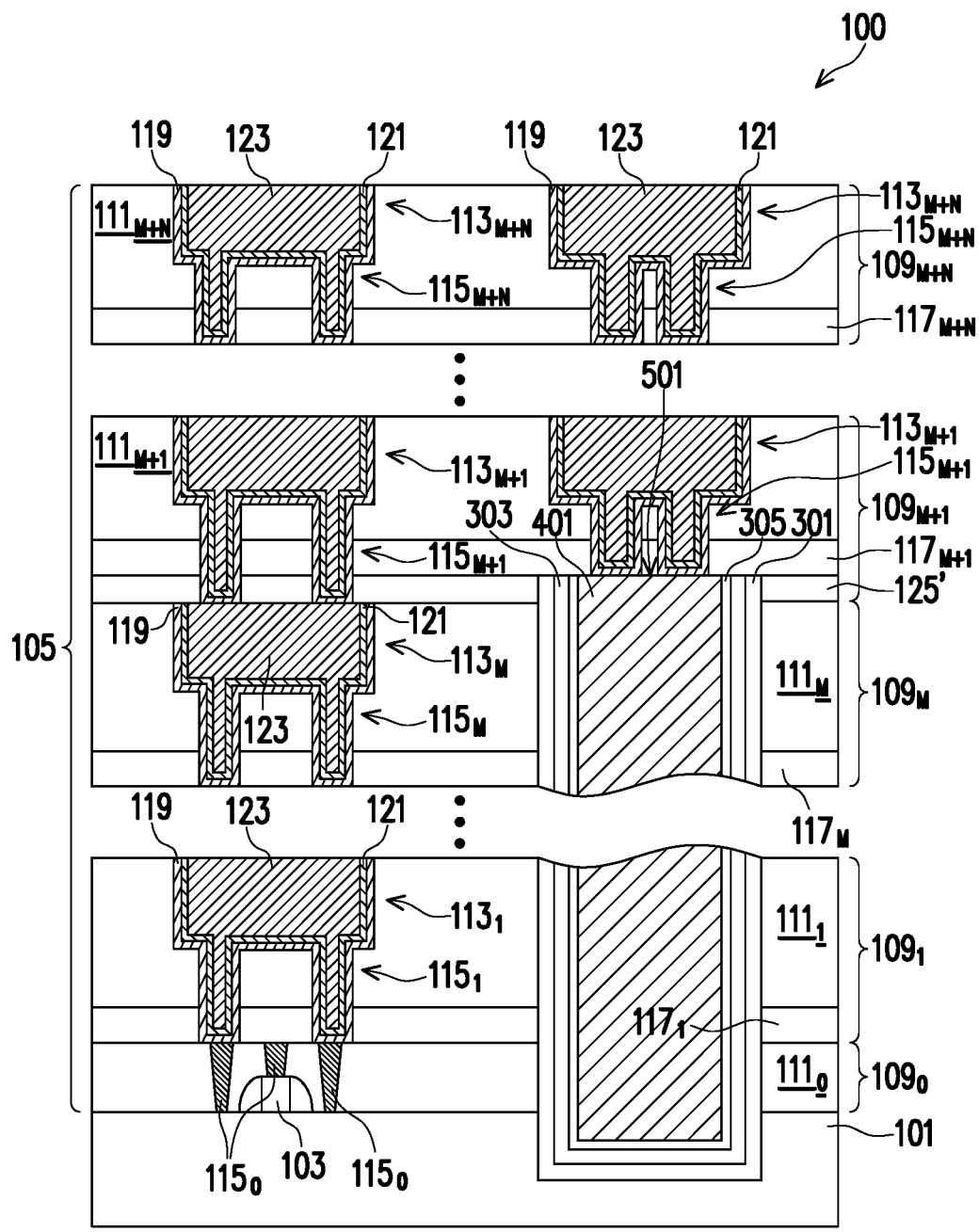

Referring to FIG. 7, in some embodiments, additional metallization layers are formed over the metallization layer $109_{M+1}$ until N metallization layers (the metallization layer $109_{M+1}$ to $109_{M+N}$) are formed over the metallization layer $109_M$ and the TSV structure 501, with the metallization layer $109_{M+N}$ being the last metallization layer of the interconnect structure 105. In some embodiments, the metallization layer $109_{M+X}$ comprises an ESL $117_{M+X}$, a dielectric layer $111_{M+X}$, and conductive interconnects comprising conductive lines $113_{M+X}$ and conductive vias $115_{M+X}$ (with X=2, . . . , N). In some embodiments, the ESL $117_{M+X}$ (with X=2, . . . , N) may be formed using similar materials and method as the ESLs $117_1$ to $117_M$ described above with reference to FIG. 1, and the description is not repeated herein. In some embodiments, the dielectric layer $111_{M+X}$ (with X=2, . . . , N) may be formed using similar materials and method as the dielectric layers $111_0$ to $111_M$ described above with reference to FIG. 1, and the description is not repeated herein. In some embodiments, the conductive lines $113_{M+X}$ and the conductive vias $115_{M+X}$ (with X=2, . . . , N) may be formed using similar materials and method as the conductive lines $113_1$ to $113_M$ and the conductive vias $115_1$ to $115_M$ described above with reference to FIG. 1, and the description is not repeated herein. In some embodiments, N is equal to 1. In other embodiments, N is greater than 1.

Figure 8:
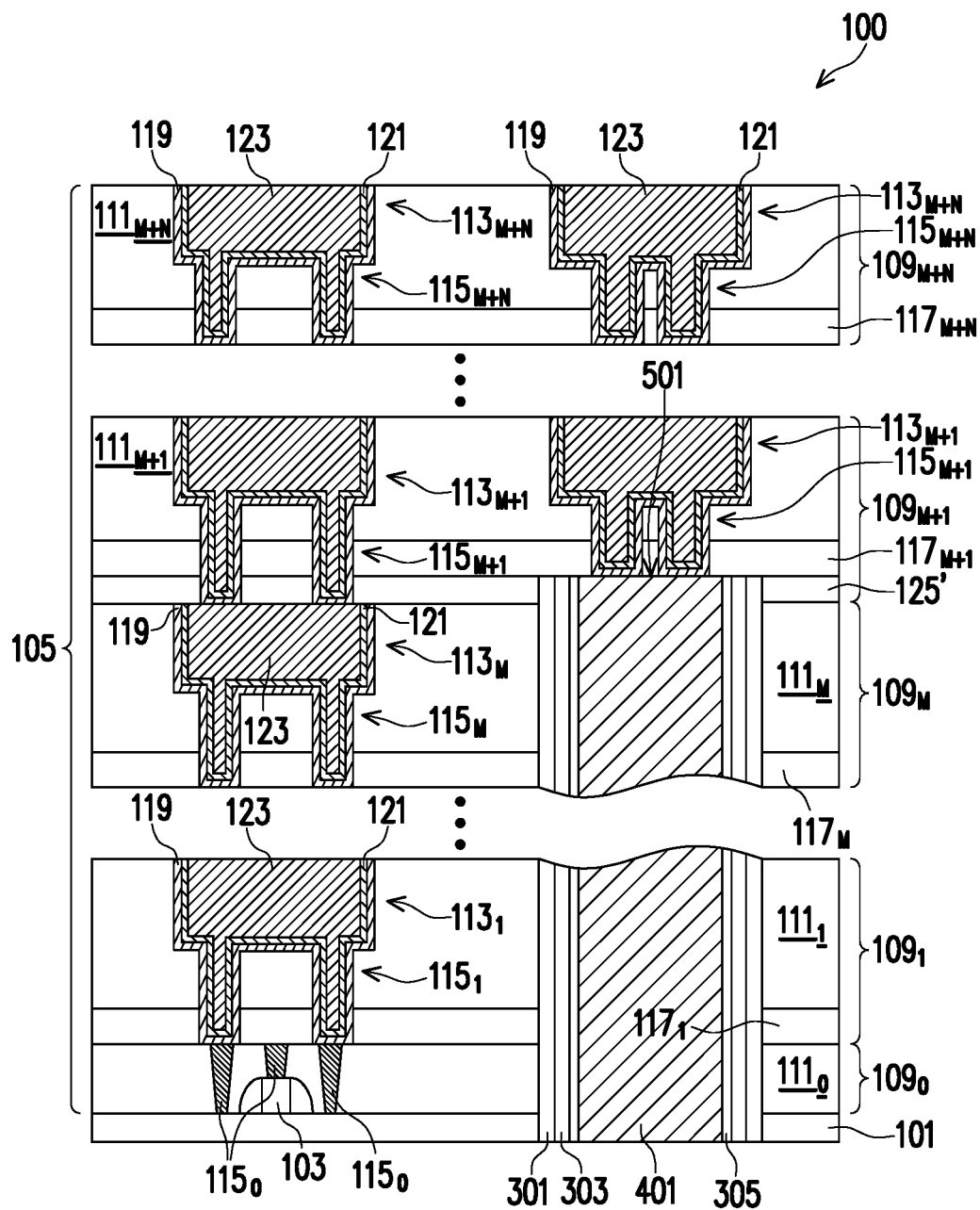

Referring to FIG. 8, after forming the last metallization layer $109_{M+N}$ of the interconnect structure 105, various process steps may be performed on the semiconductor device 100. In some embodiments, a thinning process may be formed on a backside of the substrate 101 to expose the TSV structure 501. In some embodiments, the thinning process may comprise a CMP process, a grinding process, an etching process, a combination thereof, or the like. In some embodiments, the thinning process is stopped after the conductive material 401 of the TSV structure 501 has been exposed. In other embodiments, the thinning process is stopped after the barrier layer 303 of the TSV structure 501 has been exposed. In yet other embodiments, the thinning process is stopped after the seed layer 305 of the TSV structure 501 has been exposed.

Figure 9A:
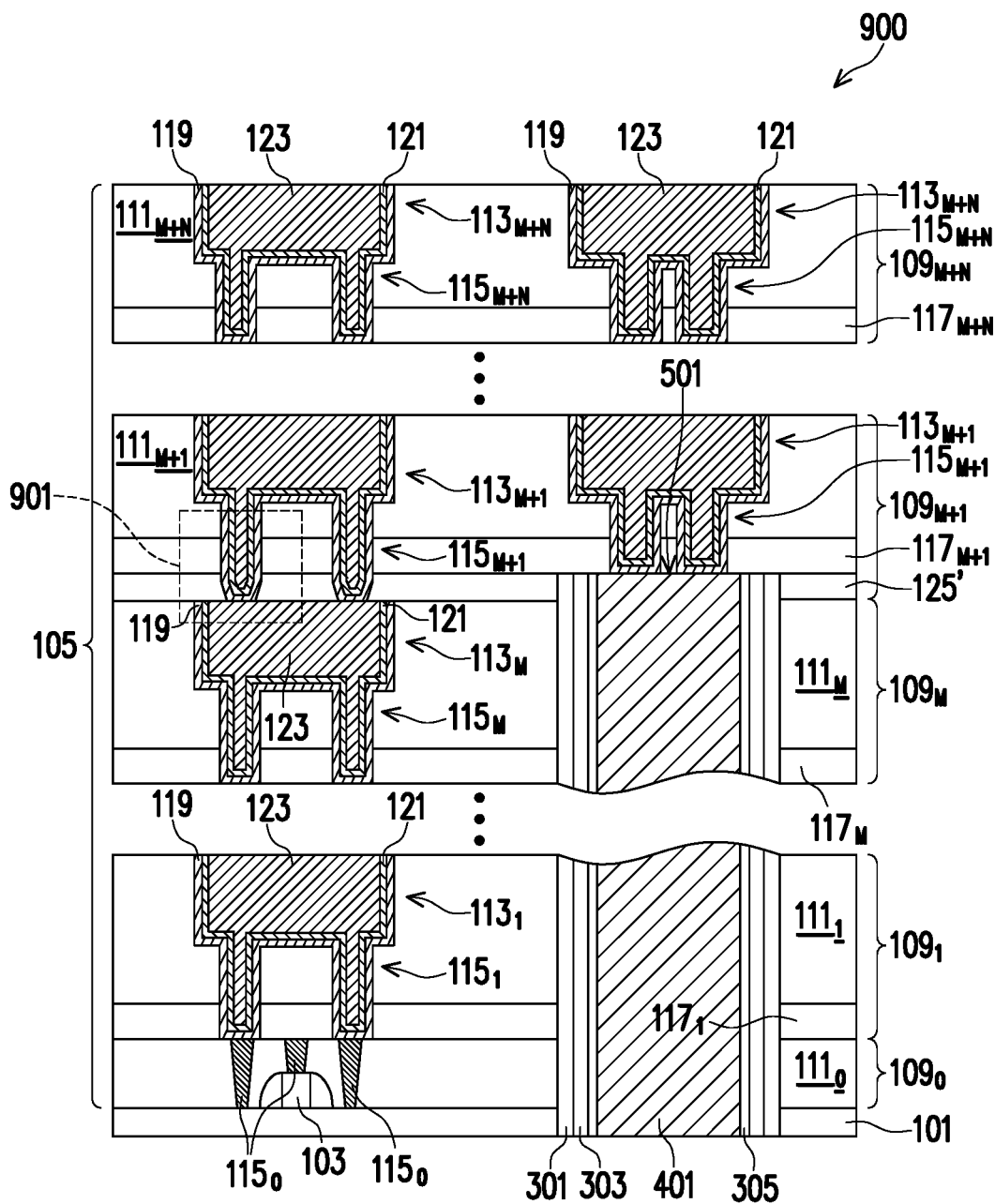
FIGS. 9A and 9B illustrate cross-sectional views of a semiconductor device in accordance with some embodiments.
Figure 9B:
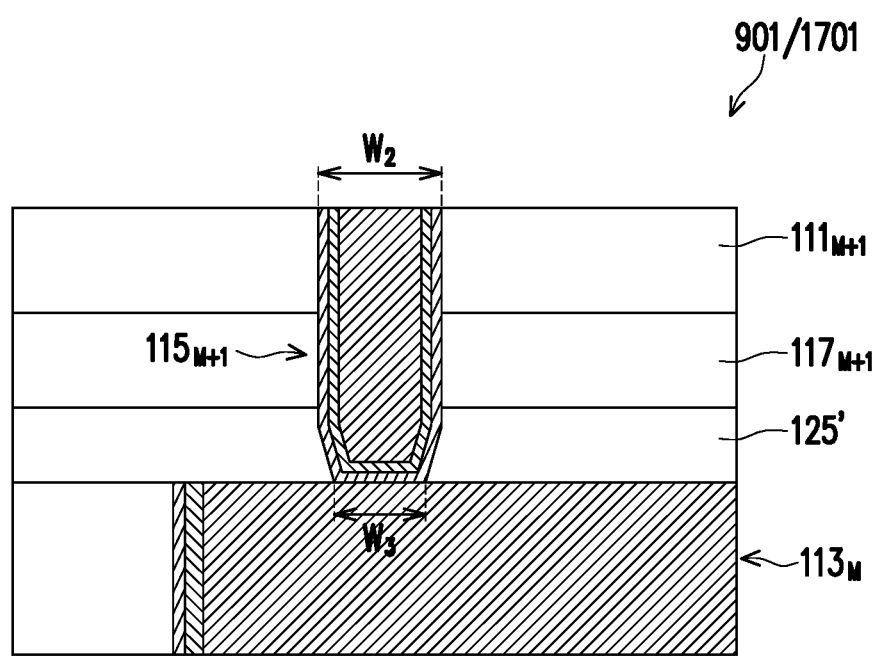

FIG. 9A illustrates a cross-sectional view of a semiconductor device 900 in accordance with some embodiments. FIG. 9B illustrates a magnified cross-sectional view of a portion 901 of the semiconductor device 900 illustrated in FIG. 9A in accordance with some embodiments. In some embodiments, the semiconductor device 900 is similar to the semiconductor device 100 illustrated in FIG. 8, with similar features being labeled by similar numerical references, and the descriptions of the similar features are not repeated herein. In some embodiments, the semiconductor device 900 may be formed using similar materials and methods as the semiconductor device 100 described above with reference to FIGS. 1-8, and the description is not repeated herein.

In the embodiment illustrated in FIGS. 9A and 9B, the ESL $117_{M+1}$ and the dielectric layer 125' comprise different materials. In some embodiments, an etch rate of the ESL $117_{M+1}$ is greater than an etch rate of the dielectric layer 125' with respect to an etching process that forms openings for the conductive vias $115_{M+1}$. In some embodiments, the etching process is a dry etching process performed using an etchant comprising a $C_xF_y$-based gas having a fluorine (F) content greater than a carbon (C) content, or the like. In such embodiments, widths of the conductive vias $115_{M+1}$ decrease as the conductive vias $115_{M+1}$ extend through the ESL $117_{M+1}$ and the dielectric layer 125'. In some embodiments, the conductive vias $115_{M+1}$ have a uniform width $W_2$ within the ESL $117_{M+1}$. In some embodiments, the width $W_2$ is between about 0.2 µm and about 0.4 µm. In some embodiments, the conductive vias $115_{M+1}$ have a non-uniform width within the dielectric layer 125'. In some embodiments, the conductive vias $115_{M+1}$ have a width $W_3$ within the dielectric layer 125' at the topmost surface of the conductive line $113_M$. In some embodiments, the width $W_3$ is between about 0.12 µm and about 0.35 µm. In some embodiments, a ratio $W_3/W_2$ is between about 0.6 to about 0.9.

Figure 10:
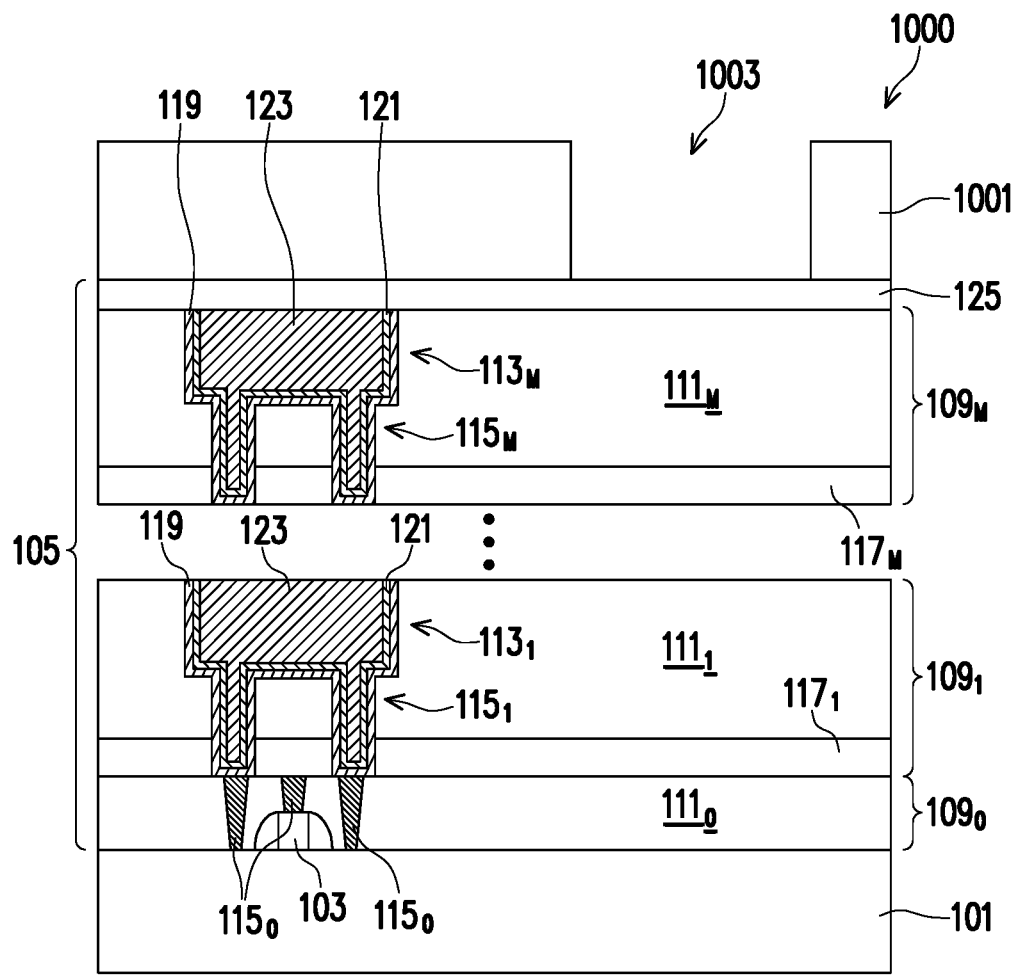
FIGS. 10-16 illustrate cross-sectional views of various intermediate stages of fabrication of a semiconductor device in accordance with some embodiments.

FIGS. 10-16 illustrate cross-sectional views of various intermediate stages of fabrication of a semiconductor device 1000 in accordance with some embodiments. Referring to FIG. 10, a method for forming the semiconductor device 1000 starts with forming a mask layer 1001 over a dielectric layer 125 of a semiconductor structure illustrated in FIG. 1. In some embodiments, the mask layer 1001 is patterned to form an opening 1003 in the mask layer 1001. In some embodiments, the mask layer 1001 may comprise one or more layers of photo-patternable and non-photo-patternable materials. In some embodiments, the mask layer 1001 may comprise a photoresist, which may be patterned using suitable photolithography methods to form the opening 1003 in the mask layer 1001. As described below in greater detail, the mask layer 1001 is used as an etch mask to form an opening in the interconnect structure 105 for a subsequently formed capacitor.

Figure 11:
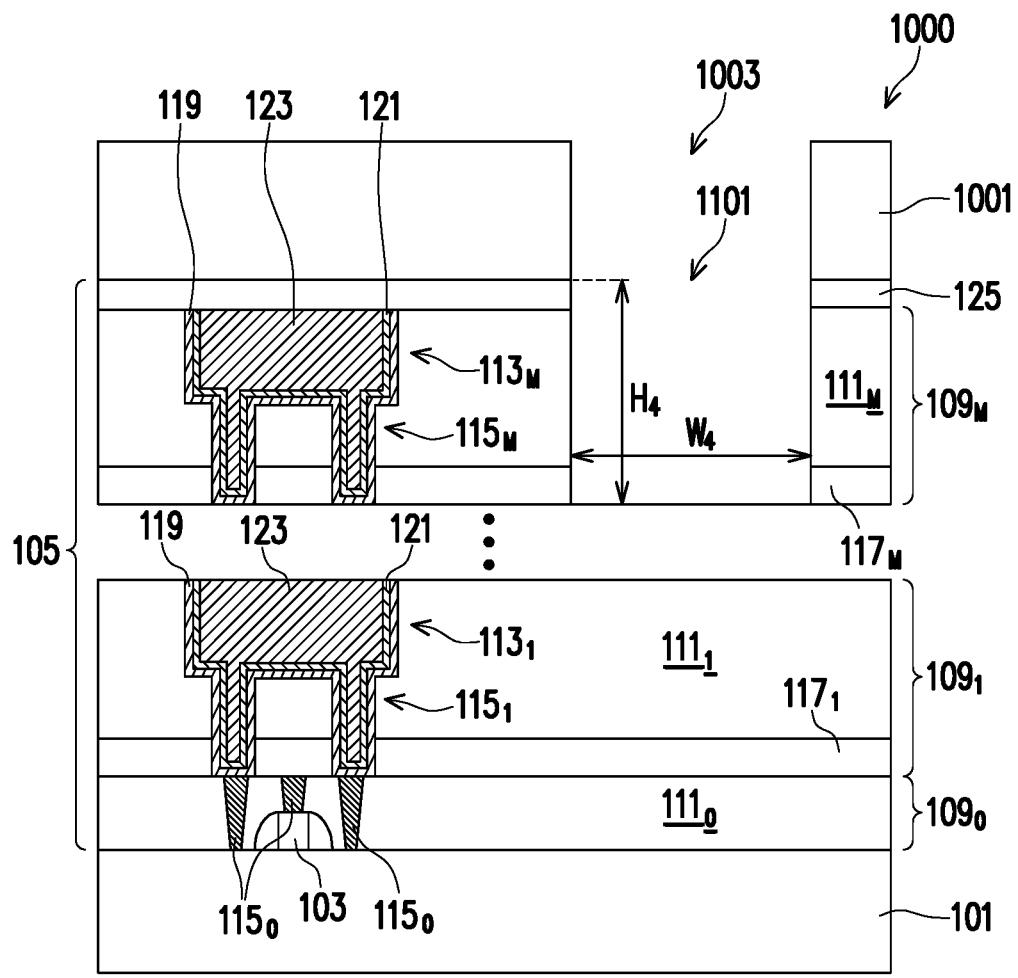

Referring to FIG. 11, the interconnect structure 105 is patterned to form an opening 1101 in the interconnect structure 105. In some embodiments, the opening 1101 extends through the dielectric layer 125, the dielectric layer $111_M$, and the ESL $117_M$. In other embodiments, the opening 1101 may also extend through one or more of the dielectric layers $111_0$ to $111_{M-1}$ and one or more of the ESLs $117_1$ to $117_{M-1}$, without extending into the substrate 101. In some embodiments, the interconnect structure 105 may be patterned using a suitable etching process, while using the mask layer 1001 as an etch mask. In some embodiments, the suitable etching process may comprise one or more dry etching processes, such as a reactive ion etching (RIE) process, a neutral beam etching (NBE) process, or the like. In some embodiments, the suitable etching process may be an anisotropic etching process. In some embodiments, the opening 1101 has a width $W_4$ between about 2.1 µm and about 5.2 µm. In some embodiments, the opening 1101 has a height $H_4$ between about 1.0 µm and about 2.0 µm.

Figure 12:
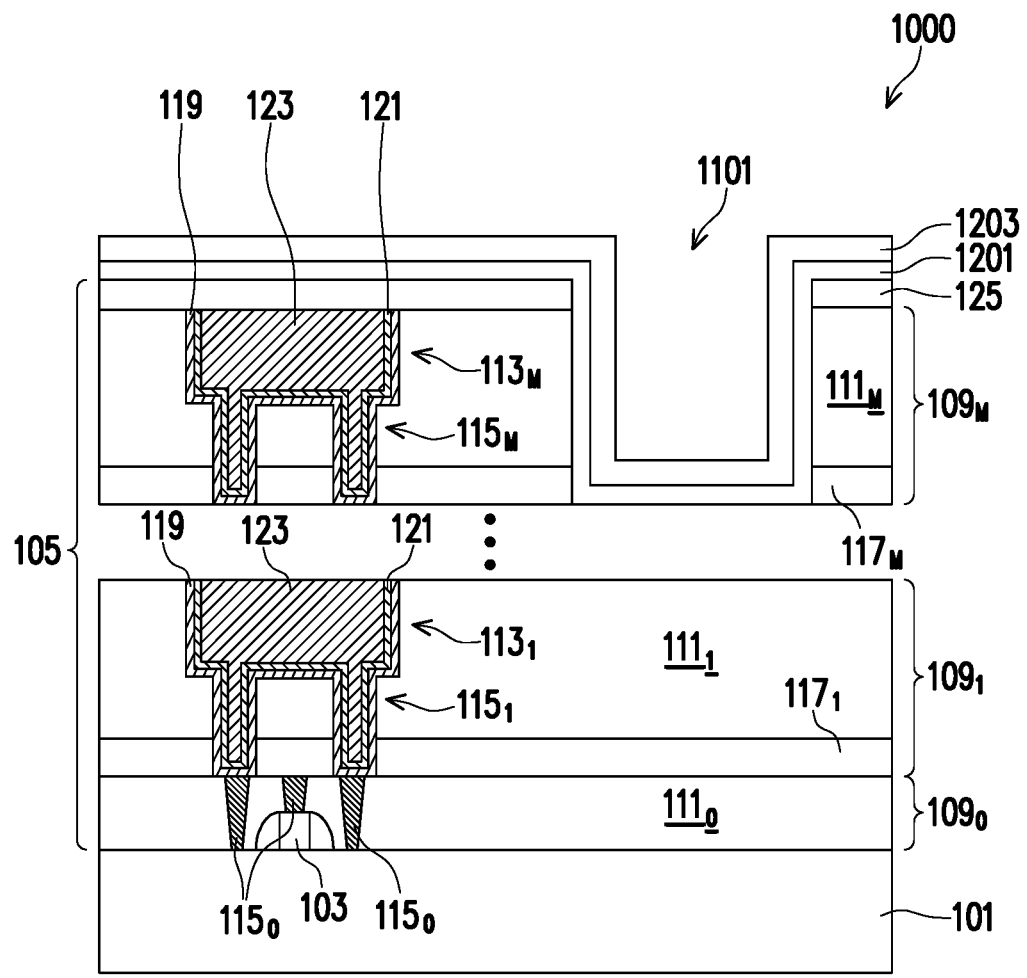

Referring to FIG. 12, after forming the opening 1101, the mask layer 1001 (see FIG. 11) is removed. In some embodiments, the mask layer 1001 formed of a photoresist may be removed using an ashing process followed by a wet clean process. Subsequently, a first conductive layer 1201 is formed along sidewalls and a bottom surface of the opening 1101 and over a top surface of the dielectric layer 125. In some embodiments, the first conductive layer 1201 may comprise one or more layers of TaN, TiN, a combination thereof, or the like, and may be formed using ALD, CVD, PECVD, a combination thereof, or the like. In some embodiments, the first conductive layer 1201 may be also referred to as a bottom electrode layer. In some embodiments, the first conductive layer 1201 has a thickness between about 400 Å and about 800 Å.

After forming the first conductive layer 1201, a dielectric layer 1203 is formed over the first conductive layer 1201. In some embodiments, the dielectric layer 1203 may comprise a high dielectric constant (k) material, such as $ZrO_2$, $HfO_2$, $Si_3N_4$, barium strontium titanate (BST), a combination thereof, or the like, and may be formed using ALD, CVD, PECVD, a combination thereof, or the like. In other embodiments, the dielectric layer 1203 may comprise other suitable dielectric materials. In some embodiments, the dielectric layer 1203 has a thickness between about 50 Å and about 100 Å.

Figure 13:
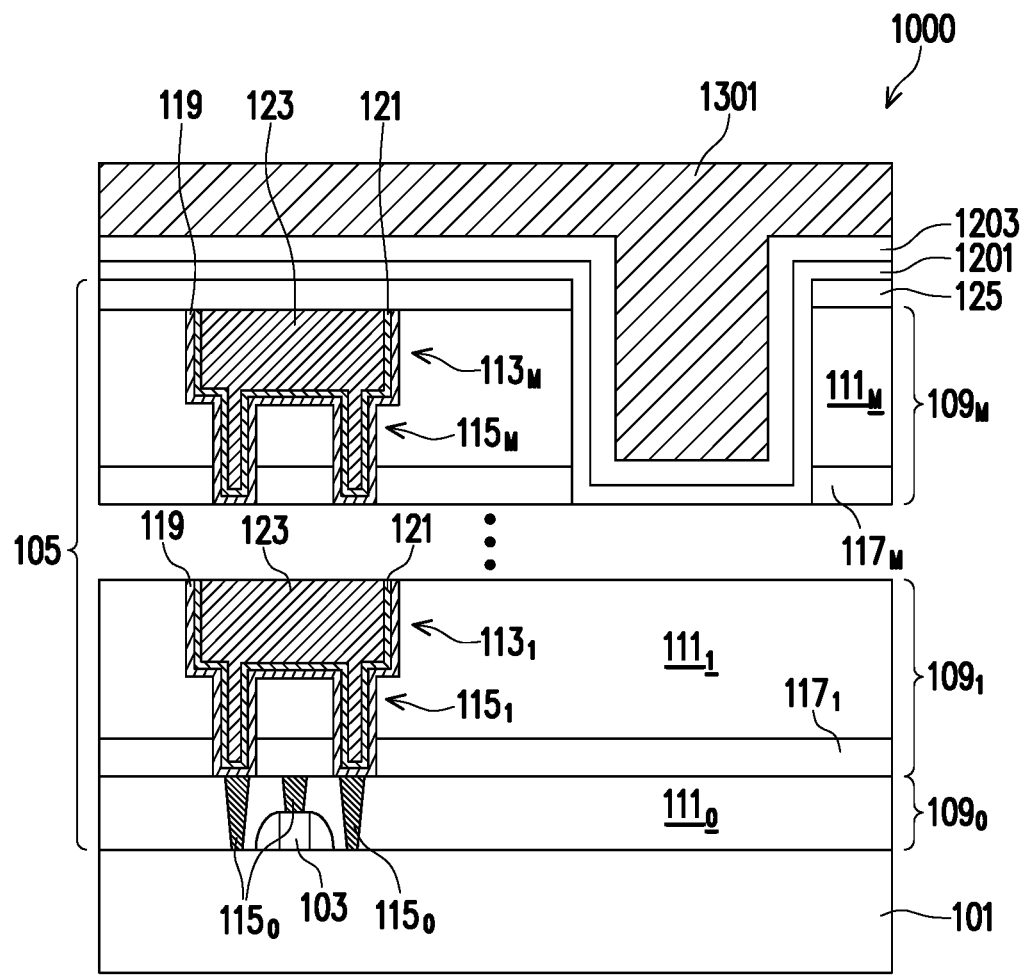

Referring to FIG. 13, a second conductive layer 1301 is formed over the dielectric layer 1203. In some embodiments, the second conductive layer 1301 overfills the remaining portion of the opening 1101 (see FIG. 12), such that a portion of the second conductive layer 1301 extends along the top surface of the dielectric layer 125. In some embodiments, the second conductive layer 1301 may comprise one or more layers of TiN, TaN, copper, a combination thereof, or the like. In some embodiments, the second conductive layer 1301 may comprise a layer of TiN or TaN formed over the dielectric layer 1203 using ALD, CVD, PECVD, a combination thereof, or the like, and a layer of copper formed over the layer of TiN or TaN using plating, or other suitable methods. In some embodiments, the second conductive layer 1301 may be also referred to as a top electrode layer.

Figure 14:
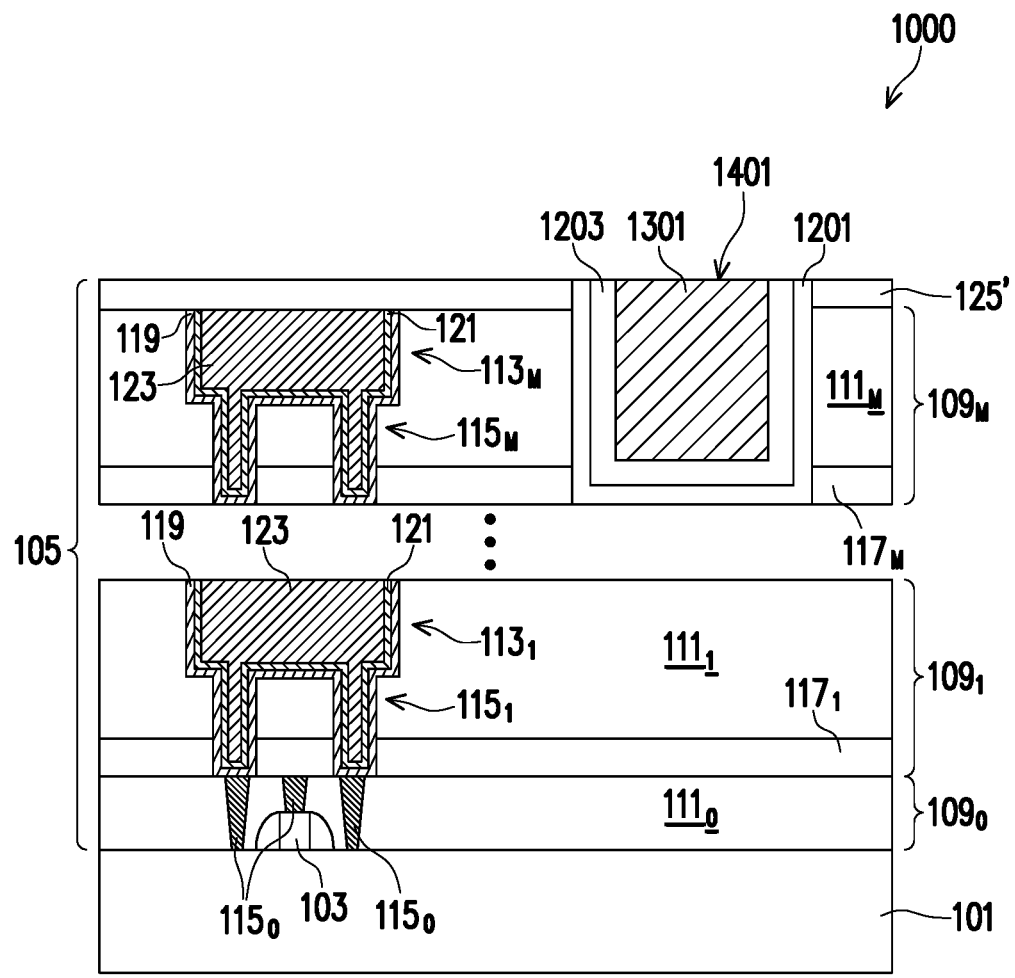

Referring to FIG. 14, potions of the first conductive layer 1201, the dielectric layer 1203, and the second conductive layer 1301 overfilling the opening 1101 (see FIG. 11) are removed. Remaining portions of the first conductive layer 1201, the dielectric layer 1203, and the second conductive layer 1301 form a capacitor 1401. In some embodiments, the capacitor 1401 may be a decoupling capacitor. The remaining portion of the first conductive layer 1201 may be also referred to as a bottom electrode and the remaining portion of the second conductive layer 1301 may be also referred to as a top electrode. In some embodiments, the bottom electrode is electrically coupled to conductive features of the interconnect structure 105. In some embodiments, the removal process may comprise a CMP process, a grinding process, an etching process, a combination thereof, or the like. In some embodiments where the removal process comprises a CMP process, the dielectric layer 125 acts as a CMP stop layer and the CMP process is stopped after exposing the dielectric layer 125 and before exposing the conductive material 123 of the conductive line $113_M$, such that at least a portion of the dielectric layer 125 covers the conductive material 123 of the conductive line $113_M$. In some embodiments, the CMP process may also thin the dielectric layer 125 to form a thinned dielectric layer 125', such that the thinned dielectric layer 125' covers the conductive material 123 of the conductive line $113_M$. In some embodiments, by keeping the thinned dielectric layer 125' over the conductive line $113_M$, dishing or erosion of the conductive line $113_M$ may be avoided while performing the CMP process. In some embodiments, a topmost surface of the capacitor 1401 is level with a topmost surface of the thinned dielectric layer 125'. In some embodiments, the thinned ESL 125' has a thickness between about 50 Å and about 200 Å, such as about 100 Å.

Figure 15:
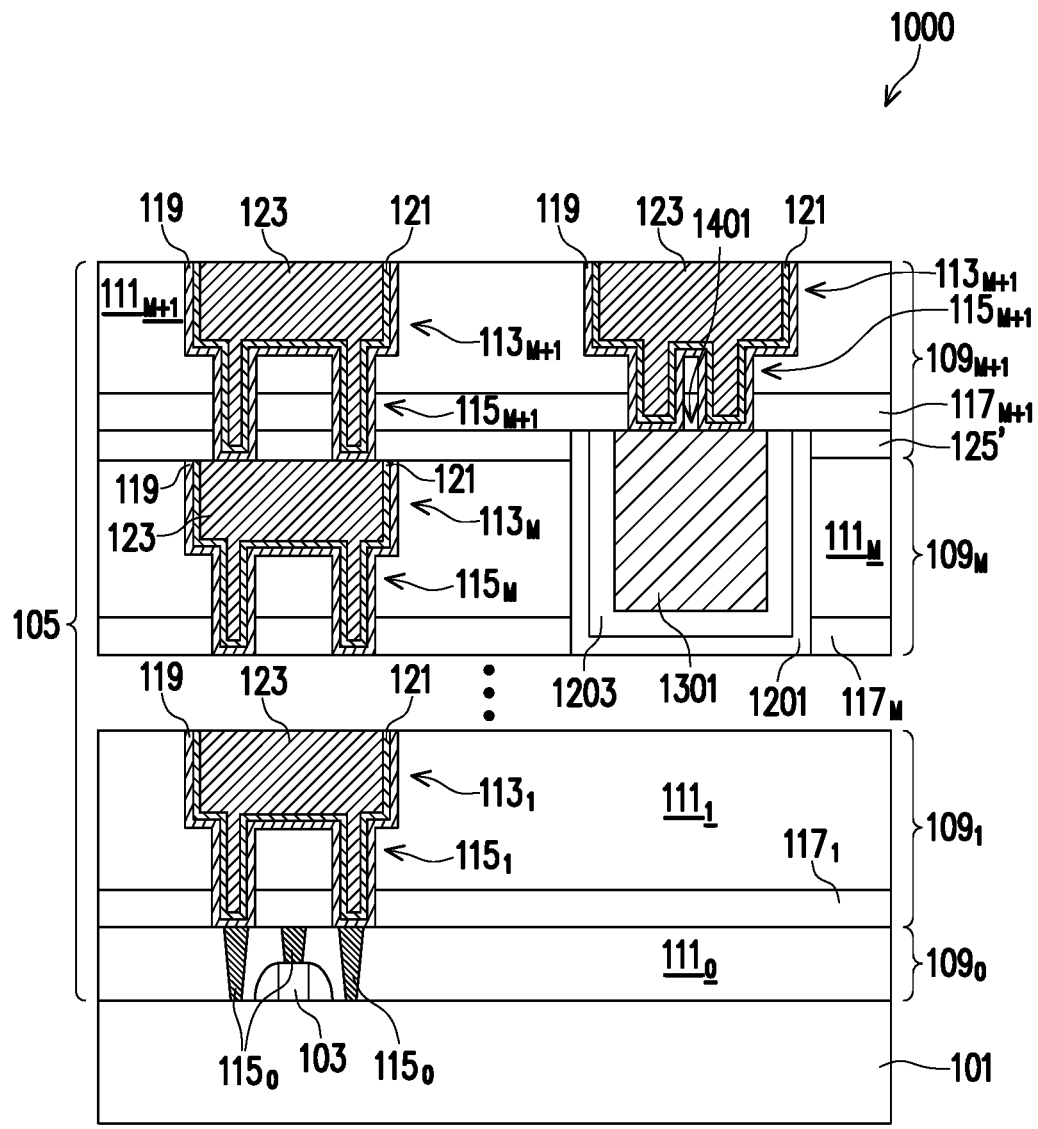

Referring to FIG. 15, after forming the capacitor 1401, a metallization layer $109_{M+1}$ is formed over the metallization layer $109_M$ and the capacitor 1401. In some embodiments, the metallization layer $109_{M+1}$ comprises an ESL $117_{M+1}$, a dielectric layer $111_{M+1}$ and conductive interconnects comprising conductive lines $113_{M+1}$ and conductive vias $115_{M+1}$. In some embodiments, the metallization layer $109_{M+1}$ is formed as described above with reference to FIG. 6, and the description is not repeated herein. In some embodiments, the dielectric layer 125' and the ESL $117_{M+1}$ act as a combined ESL, which is used to aid in forming openings for the conductive vias $115_{M+1}$. In the embodiment illustrated in FIG. 15, the ESL $117_{M+1}$ and the dielectric layer 125' comprise a same material. In such embodiments, an interface between the ESL $117_{M+1}$ and the dielectric layer 125' may not be detectable. Furthermore, widths of the conductive vias $115_{M+1}$ do not change as the conductive vias $115_{M+1}$ extend through the ESL $117_{M+1}$ and the dielectric layer 125'. In other embodiments, the ESL $117_{M+1}$ and the dielectric layer 125' may comprise different materials. Such an embodiment is illustrated in FIG. 17.

Figure 16:
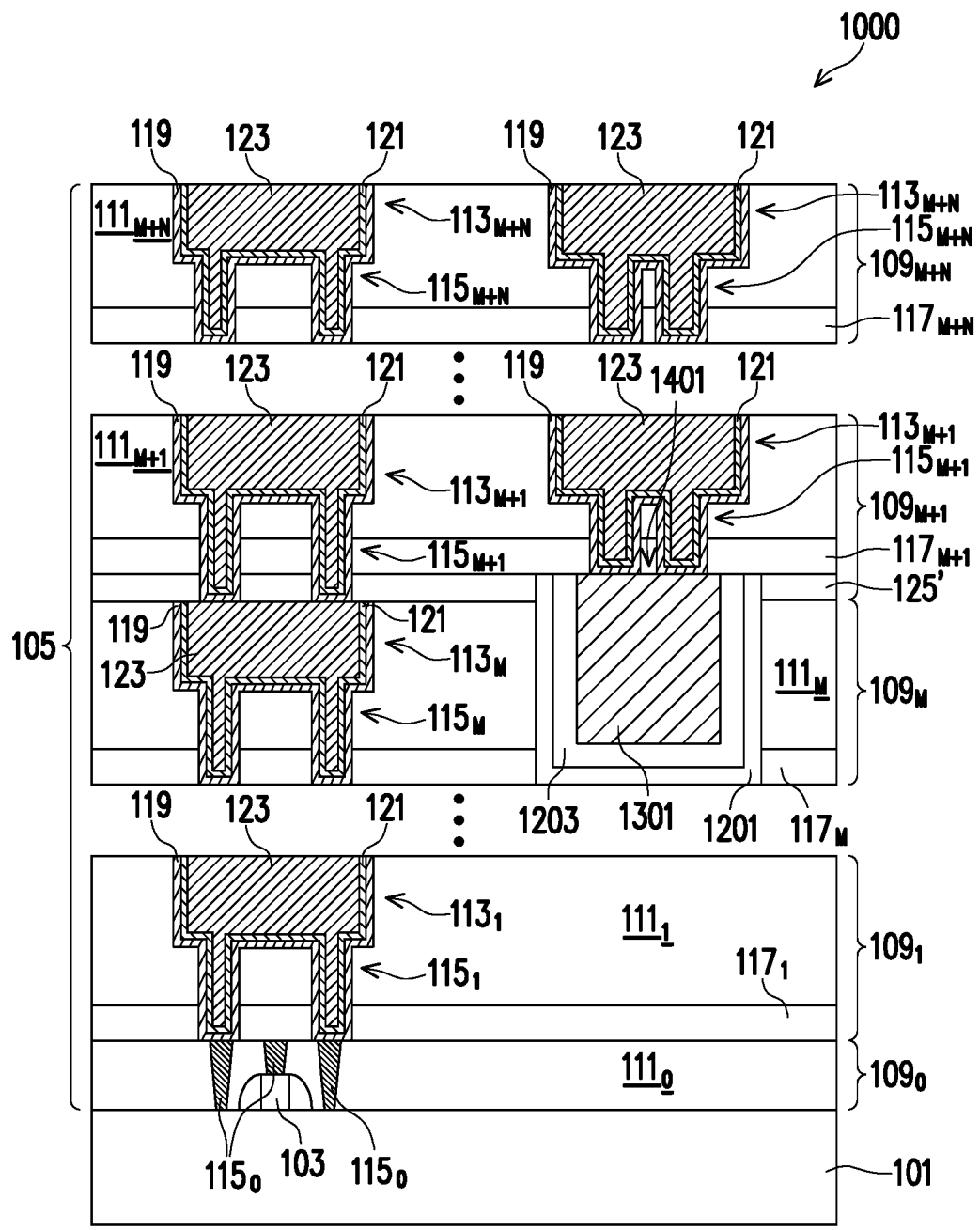

Referring to FIG. 16, in some embodiments, additional metallization layers are formed over the metallization layer $109_{M+1}$ until N metallization layers (the metallization layer $109_{M+1}$ to $109_{M+N}$) are formed over the metallization layer $109_M$ and the capacitor 1401, with the metallization layer $109_{M+N}$ being the last metallization layer of the interconnect structure 105. In some embodiments, N is equal to 1. In other embodiments, N is greater than 1. In some embodiments, the additional metallization layers are formed as described above with reference to FIG. 7, and the description is not repeated herein.

Figure 17:
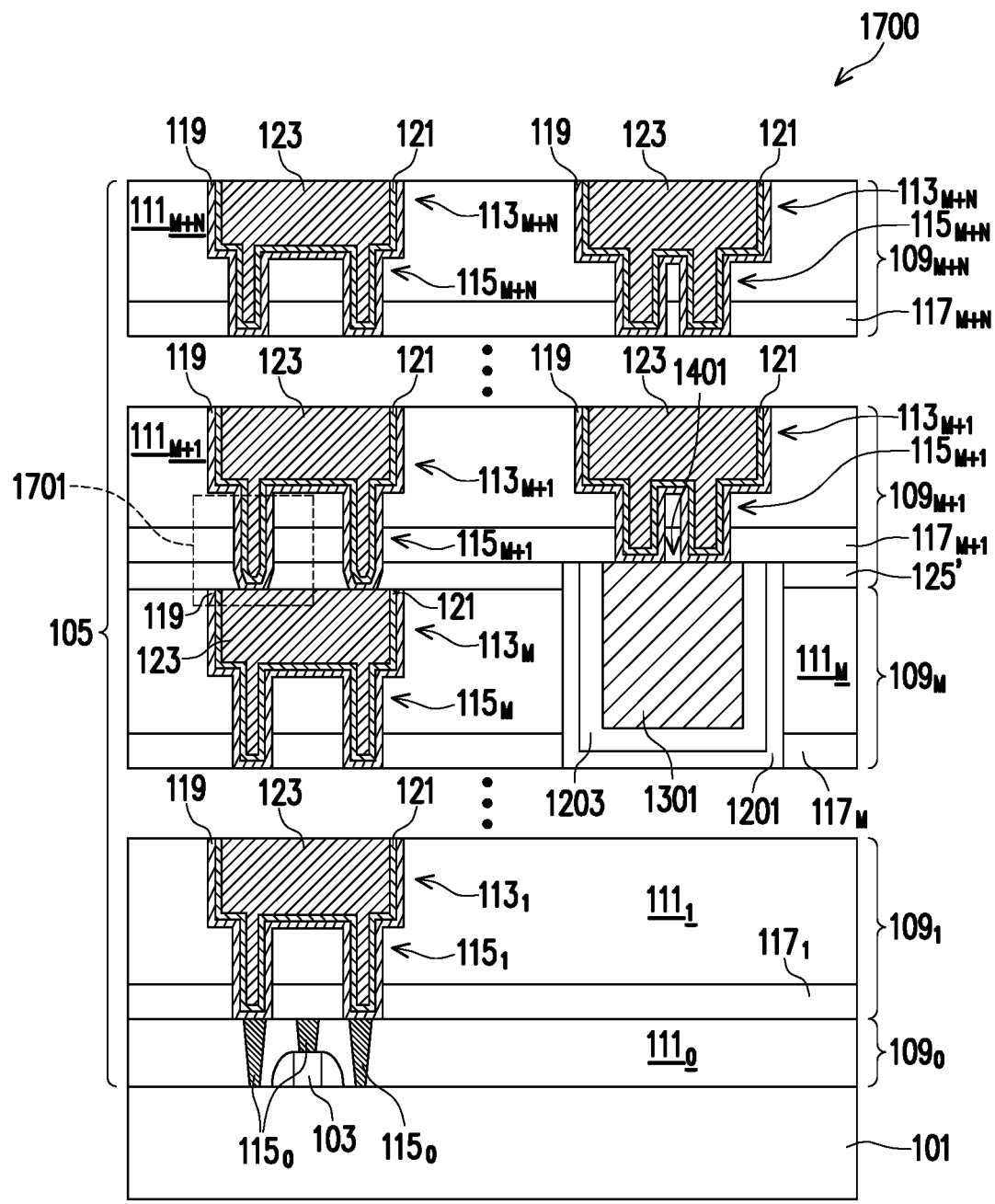
FIG. 17 illustrates a cross-sectional view of a semiconductor device in accordance with some embodiments.

FIG. 17 illustrates a cross-sectional view of a semiconductor device 1700, with FIG. 9B illustrating a magnified cross-sectional view of a portion 1701 of the semiconductor device 1700, in accordance with some embodiments. In some embodiments, the semiconductor device 1700 is similar to the semiconductor device 1000 illustrated in FIG. 16, with similar features being labeled by similar numerical references, and the descriptions of the similar features are not repeated herein. In some embodiments, the semiconductor device 1700 may be formed using similar materials and methods as the semiconductor device 1000 described above with reference to FIGS. 10-16, and the description is not repeated herein. In the embodiment illustrated in FIG. 17, the ESL $117_{M+1}$ and the dielectric layer 125' comprise different materials. In some embodiments, an etch rate of the ESL $117_{M+1}$ is greater than an etch rate of the dielectric layer 125' with respect to an etching process that forms openings for the conductive vias $115_{M+1}$. In such embodiments, widths of the conductive vias $115_{M+1}$ decrease as the conductive vias $115_{M+1}$ extend through the ESL $117_{M+1}$ and the dielectric layer 125'.

Referring to FIG. 9B, in some embodiments, the conductive vias $115_{M+1}$ have a uniform width $W_2$ within the ESL $117_{M+1}$. In some embodiments, the width $W_2$ is between about 0.2 μm and about 0.4 μm. In some embodiments, the conductive vias $115_{M+1}$ have a non-uniform width within the dielectric layer 125'. In some embodiments, the conductive vias $115_{M+1}$ have a width $W_3$ within the dielectric layer 125' at the topmost surface of the conductive line $113_M$. In some embodiments, the width $W_3$ is between about 0.12 μm and about 0.35 μm. In some embodiments, a ratio $W_3/W_2$ is between about 0.6 to about 0.9.

Figure 18:
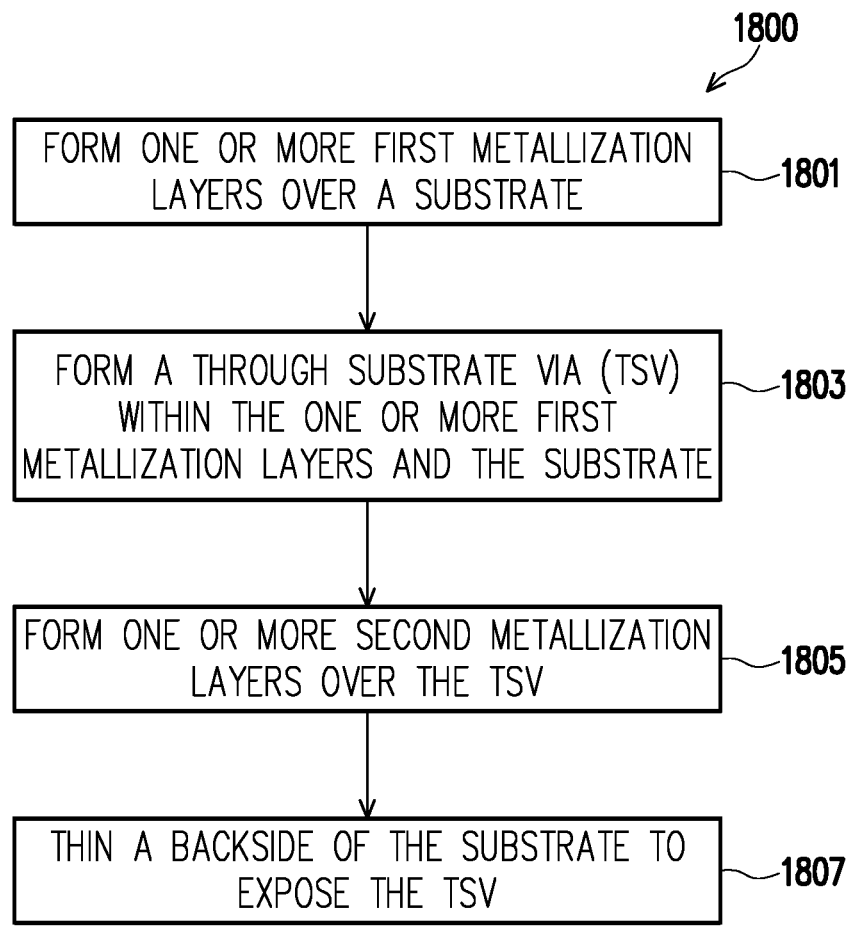
FIG. 18 is a flow diagram illustrating a method of forming a semiconductor device in accordance with some embodiments.

FIG. 18 is a flow diagram illustrating a method 1800 of forming a semiconductor device in accordance with some embodiments. The method 1800 starts with step 1801, where one or more first metallization layers (such as the one or more metallization layers $109_0$ to $109_M$ illustrated in FIG. 1) are formed over a substrate (such as the substrate 101 illustrated in FIG. 1) as described above with reference to FIG. 1. In step 1803, a through substrate via (TSV) (such as the TSV structure 501 illustrated in FIG. 5) is formed within the one or more first metallization layers and the substrate as described above with reference to FIGS. 2-5. In step 1805, one or more second metallization layers (such as the one or more metallization layers $109_{M+1}$ to $109_{M+N}$ illustrated in FIG. 7) are formed over the TSV as described above with reference to FIGS. 6 and 7. In step 1807, a backside of the substrate is thinned to expose the TSV as described above with reference to FIG. 8.

Figure 19:
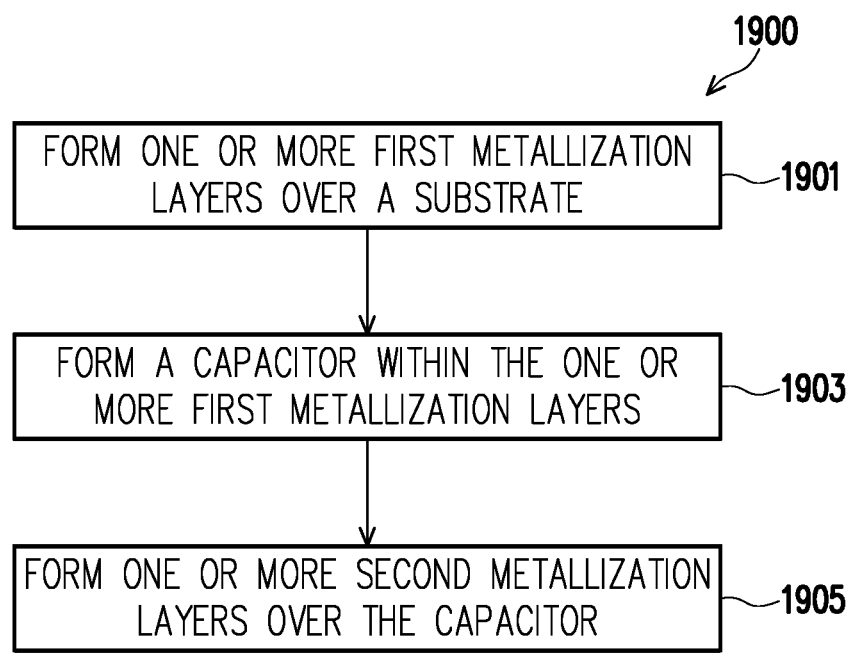
FIG. 19 is a flow diagram illustrating a method of forming a semiconductor device in accordance with some embodiments.

FIG. 19 is a flow diagram illustrating a method 1900 of forming a semiconductor device in accordance with some embodiments. The method 1900 starts with step 1901, where one or more first metallization layers (such as the one or more metallization layers $109_0$ to $109_M$ illustrated in FIG. 10) are formed over a substrate (such as the substrate 101 illustrated in FIG. 10) as described above with reference to FIG. 10. In step 1903, a capacitor (such as the capacitor 1401 illustrated in FIG. 14) is formed within the one or more first metallization layers as described above with reference to FIGS. 10-14. In step 1905, one or more second metallization layers (such as the one or more metallization layers $109_{M+1}$ to $109_{M+N}$ illustrated in FIG. 16) are formed over the capacitor as described above with reference to FIGS. 15 and 16.

In accordance with an embodiment, a method includes: forming a first dielectric layer over a substrate; forming a first interconnect in the first dielectric layer; forming a second dielectric layer over the first dielectric layer and the first interconnect; forming a through via within the first dielectric layer, the second dielectric layer and the substrate, where forming the through via includes: forming an opening in the first dielectric layer, the second dielectric layer and the substrate, the opening being disposed adjacent the first interconnect; depositing a conductive material in the opening and over the second dielectric layer; and performing a planarization process on the conductive material to expose the second dielectric layer; forming a third dielectric layer over the second dielectric layer and the through via; forming a fourth dielectric layer over the third dielectric layer; and forming a second interconnect in the fourth dielectric layer, the second interconnect extending through the third dielectric layer and the second dielectric layer and physically contacting the first interconnect. In an embodiment, the second dielectric layer and the third dielectric layer include a same material. In an embodiment, the second dielectric layer and the third dielectric layer include different materials. In an embodiment, the second interconnect narrows as the second interconnect extends through the second dielectric layer toward the first interconnect. In an embodiment, the planarization process reduces a thickness of the second dielectric layer. In an embodiment, the method further includes forming a third interconnect in the fourth dielectric layer, the third interconnect extending through the third dielectric layer and physically contacting the through via. In an embodiment, forming the through via further includes forming an insulating liner along sidewalls and a bottom of the opening.

In accordance with another embodiment, a method includes: forming a first dielectric layer over a substrate; forming a first interconnect in the first dielectric layer; forming a second dielectric layer over the first dielectric layer and the first interconnect; forming a capacitor within the first dielectric layer and the second dielectric layer, where forming the capacitor includes: forming an opening in the first dielectric layer and the second dielectric layer, the opening being disposed adjacent the first interconnect; forming a first conductive layer along sidewalls and a bottom of the opening and over the second dielectric layer; forming a third dielectric layer over the first conductive layer; forming a second conductive layer over the third dielectric layer; and performing a planarization process on the first conductive layer, the third dielectric layer and the second conductive layer to expose the second dielectric layer; forming a fourth dielectric layer over the second dielectric layer and the capacitor; forming a fifth dielectric layer over the fourth dielectric layer; and forming a second interconnect in the fifth dielectric layer, the second interconnect extending through the fourth dielectric layer and the second dielectric layer and physically contacting the first interconnect. In an embodiment, the second dielectric layer and the fourth dielectric layer include a same material. In an embodiment, the second dielectric layer and the fourth dielectric layer include different materials. In an embodiment, a width of the second interconnect decreases as the second interconnect extends through the second dielectric layer toward the first interconnect. In an embodiment, the planarization process removes a portion of the second dielectric layer. In an embodiment, the method further includes forming a third interconnect in the fifth dielectric layer, the third interconnect extending through the fourth dielectric layer and physically contacting the second conductive layer. In an embodiment, an etch rate of the fourth dielectric layer is greater than an etch rate of the second dielectric layer.

In accordance with yet another embodiment, a device includes: a substrate; a first dielectric layer over the substrate; a first interconnect in the first dielectric layer; a second dielectric layer over the first dielectric layer and the first interconnect; a conductive via extending through the first dielectric layer, the second dielectric layer and the substrate, a topmost surface of the conductive via being level with a topmost surface of the second dielectric layer; a third dielectric layer over the second dielectric layer and the conductive via; a fourth dielectric layer over the third dielectric layer; and a second interconnect in the fourth dielectric layer, the second interconnect extending through the third dielectric layer and the second dielectric layer and physically contacting the first interconnect. In an embodiment, the second dielectric layer and the third dielectric layer include a same material. In an embodiment, the second dielectric layer and the third dielectric layer include different materials. In an embodiment, the second interconnect narrows as the second interconnect extends through the second dielectric layer toward the first interconnect. In an embodiment, the device further includes a third interconnect in the fourth dielectric layer, the third interconnect extending through the third dielectric layer and physically contacting the conductive via. In an embodiment, a bottommost surface of the conductive via is level with a surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first dielectric layer over a substrate;
forming a first interconnect in the first dielectric layer;
forming a second dielectric layer over the first dielectric layer and the first interconnect;
forming a through via within the first dielectric layer, the second dielectric layer and the substrate, wherein forming the through via comprises:
 forming an opening in the first dielectric layer, the second dielectric layer and the substrate, the opening being disposed adjacent the first interconnect;
 depositing a conductive material in the opening and over the second dielectric layer; and
 performing a planarization process on the conductive material to expose the second dielectric layer;
forming a third dielectric layer over the second dielectric layer and the through via;
forming a fourth dielectric layer over the third dielectric layer; and
forming a second interconnect in the fourth dielectric layer, the second interconnect extending through the third dielectric layer and the second dielectric layer and physically contacting the first interconnect.

2. The method of claim 1, wherein the second dielectric layer and the third dielectric layer comprise a same material.

3. The method of claim 1, wherein the second dielectric layer and the third dielectric layer comprise different materials.

4. The method of claim 1, wherein the second interconnect narrows as the second interconnect extends through the second dielectric layer toward the first interconnect.

5. The method of claim 1, wherein the planarization process reduces a thickness of the second dielectric layer.

6. The method of claim 1, further comprising forming a third interconnect in the fourth dielectric layer, the third interconnect extending through the third dielectric layer and physically contacting the through via.

7. The method of claim 1, wherein forming the through via further comprises forming an insulating liner along sidewalls and a bottom of the opening.

8. A method comprising:
forming a first interconnect in a first dielectric layer;
forming a second dielectric layer over the first dielectric layer and the first interconnect;
forming a through via adjacent the first interconnect, the through via extending through the first dielectric layer and the second dielectric layer, wherein forming the through via comprises:
 etching the first dielectric layer and the second dielectric layer to form an opening therein;
 depositing a third dielectric layer along sidewalls and a bottom of the opening; and
 filling the opening with a conductive material; and
 removing a portion of the conductive material and a portion of the third dielectric layer to expose the second dielectric layer;
forming a fourth dielectric layer over the second dielectric layer and the through via; and
forming a second interconnect over the first interconnect, the second interconnect extending through the second dielectric layer and the fourth dielectric layer and physically contacting a top surface of the first interconnect.

9. The method of claim 8, wherein the second dielectric layer and the fourth dielectric layer comprise a same material.

10. The method of claim 8, wherein the second dielectric layer and the fourth dielectric layer comprise different materials.

11. The method of claim 8, further comprising forming a third interconnect over the through via, the third interconnect extending through the fourth dielectric layer and physically contacting a top surface of the through via.

12. The method of claim 8, wherein the second interconnect has sloped sidewalls within the second dielectric layer.

13. The method of claim 8, wherein the second interconnect has a first width in the fourth dielectric layer and a second width in the second dielectric layer, and wherein the first width is greater than the second width.

14. The method of claim 13, wherein a ratio of the second width to the first width is between about 0.6 and about 0.9.

15. A method comprising:
forming a first dielectric layer over a substrate;
forming a first interconnect in the first dielectric layer;
forming a second dielectric layer over the first dielectric layer and the first interconnect;
patterning the first dielectric layer, the second dielectric layer, and the substrate to form an opening therein, the opening being disposed adjacent the first interconnect;
filling the opening with a conductive material;
forming a third dielectric layer over and in physical contact with the second dielectric layer and the conductive material; and
forming a second interconnect over the first interconnect, the second interconnect extending through the second dielectric layer and the third dielectric layer and physically contacting the first interconnect.

16. The method of claim 15, further comprising performing a thinning process on the substrate to exposed a surface of the conductive material.

17. The method of claim 15, wherein the second interconnect has a non-uniform width within the second dielectric layer.

18. The method of claim 15, further comprising, before filling the opening with the conductive material, forming an insulating liner along sidewalls and a bottom of the opening.

19. The method of claim 15, wherein a topmost surface of the conductive material is above a topmost surface of the first interconnect.

20. The method of claim 15, wherein the second dielectric layer and the third dielectric layer comprise different materials.

* * * * *